(12) United States Patent
Disney

(10) Patent No.: US 9,391,179 B2
(45) Date of Patent: Jul. 12, 2016

(54) VERTICAL GAN JFET WITH LOW GATE-DRAIN CAPACITANCE AND HIGH GATE-SOURCE CAPACITANCE

(71) Applicant: Avogy, Inc., San Jose, CA (US)

(72) Inventor: Donald R. Disney, Cupertino, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 14/604,606

(22) Filed: Jan. 23, 2015

(65) Prior Publication Data

US 2015/0132900 A1 May 14, 2015

Related U.S. Application Data

(62) Division of application No. 13/675,694, filed on Nov. 13, 2012, now Pat. No. 8,969,926.

(51) Int. Cl.
| | | |
|---|---|---|
| *H01L 21/04* | (2006.01) | |
| *H01L 29/66* | (2006.01) | |
| *H01L 29/808* | (2006.01) | |

(52) U.S. Cl.
CPC .......... *H01L 29/66909* (2013.01); *H01L 21/04* (2013.01); *H01L 29/66462* (2013.01); *H01L 29/66924* (2013.01); *H01L 29/8083* (2013.01)

(58) Field of Classification Search
CPC ..... H01L 21/18; H01L 21/20; H01L 21/2056; H01L 21/26546; H01L 21/04
USPC ................... 438/137–138, 186–192
See application file for complete search history.

(56) References Cited

U.S. PATENT DOCUMENTS 9,224,828 B2 * 12/2015 Edwards ........... H01L 21/26546

* cited by examiner

*Primary Examiner* — Cuong Q Nguyen
(74) *Attorney, Agent, or Firm* — Kilpatrick Townsend & Stockton LLP (57) ABSTRACT

An embodiment of a vertical power device includes a III-nitride substrate, a drift region coupled to the III-nitride substrate and comprising a III-nitride material of a first conductivity type, and a channel region coupled to the drift region and comprising a III-nitride material of the first conductivity type. The vertical power device also includes a source region coupled to the channel region and comprising a III-nitride material of the first conductivity type, and a gate region coupled to the channel region. The gate region includes a III-nitride material of a second conductivity type. The vertical power device further includes a source-coupled region coupled to the drift region and electrically connected with the source region. The source-coupled region includes a III-nitride material of the second conductivity type.

18 Claims, 5 Drawing Sheets

VERTICAL GAN JFET WITH LOW GATE-DRAIN CAPACITANCE AND HIGH GATE-SOURCE CAPACITANCE

CROSS-REFERENCES TO RELATED APPLICATIONS

The present application is a divisional of U.S. patent application Ser. No. 13/675,694, entitled "VERTICAL GAN JFET WITH LOW GATE-DRAIN CAPACITANCE AND HIGH GATE-SOURCE CAPACITANCE," filed on Nov. 13, 2012. U.S. patent application Ser. No. 13/675,694 is further related to U.S. patent application Ser. No. 13/315,720 filed on Dec. 9, 2011. The entire disclosures of both of the above applications are hereby incorporated by reference, for all purposes, as if fully set forth herein.

BACKGROUND

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY

The present invention relates generally to electronic devices. More specifically, the present invention relates to forming vertical junction gate field-effect transistors (JFETs) with reduced gate-to-drain capacitance using III-nitride semiconductor materials. Merely by way of example, the invention has been applied to methods and systems for manufacturing a vertical JFET power transistor using gallium-nitride (GaN) based epitaxial layers. The methods and techniques can be applied to a variety of compound semiconductor systems, and may further employ edge termination structures to help ensure a desired breakdown voltage.

An embodiment of a vertical power device, according to the disclosure, can include a III-nitride substrate, a drift region coupled to the III-nitride substrate and comprising a III-nitride material of a first conductivity type, a channel region coupled to the drift region and comprising a III-nitride material of the first conductivity type, and a source region coupled to the channel region and comprising a III-nitride material of the first conductivity type. The vertical power device can further include a gate region coupled to the channel region. The gate region can include a III-nitride material of a second conductivity type. The vertical power device can also include a source-coupled region coupled to the drift region and electrically connected with the source region. The source-coupled region can include a III-nitride material of the second conductivity type.

An embodiment of a method, according to the disclosure, can include providing a III-nitride substrate, and forming a channel region and a drift region. The drift region and the channel region can include a III-nitride material of a first conductivity type. The drift region can be coupled to the III-nitride substrate. The method can also include forming a source region coupled to the channel region, and forming a gate region coupled to the channel region. The gate region can include a III-nitride material of a second conductivity type. The method can further include forming a source-coupled region coupled to the drift region, and electrically connecting the source-coupled region to the source region.

Another embodiment of a method, according to the disclosure, can include providing a III-nitride substrate, forming a first III-nitride epitaxial layer coupled to the III-nitride substrate, and forming a source region coupled to the first III-nitride epitaxial layer. The method can further include removing at least a portion of the first III-nitride epitaxial layer and at least a portion of the source region to form a channel region, a drift region, and a separation region. The method can also include forming a second III-nitride epitaxial layer coupled to the channel region and the drift region, where the second III-nitride epitaxial layer includes a gate region and a source-coupled region, and the gate region and the source-coupled region are separated by the separation region. The method can further include forming a metal structure electrically connecting the source region with the source-coupled region.

Numerous benefits are achieved by way of the present invention over conventional techniques. For example, embodiments of the present invention help minimize the Miller effect and ensure higher switching speeds. Embodiments of the present invention can also help ensure proper voltage on the gate of a JFET by ensuring voltage division from the gate-to-source capacitance and the gate-to-drain capacitance is dominated by the gate-to-source capacitance. These and other embodiments of the invention, along with many of its advantages and features, are described in more detail in conjunction with the text below and attached figures.

DETAILED DESCRIPTION

The present invention relates generally to electronic devices. More specifically, the present invention relates to forming vertical junction gate field-effect transistors (JFETs) with reduced gate-to-drain capacitance using III-nitride semiconductor materials. Merely by way of example, the invention has been applied to methods and systems for manufacturing a vertical JFET power transistor using gallium-nitride (GaN) based epitaxial layers. The methods and techniques can be applied to a variety of compound semiconductor systems, and may further employ edge termination structures to help ensure a desired breakdown voltage.

GaN-based electronic and optoelectronic devices are undergoing rapid development, and generally are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, μ, is higher than competing materials for a given background doping level, N. This provides low resistivity, ρ, because resistivity is inversely proportional to electron mobility, as provided by equation (1):

$$\rho = \frac{1}{q\mu N},\quad (1)$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R=\rho L/A,\quad (2)$$

where A is the cross-sectional area of the channel or current path.

Semiconductor devices utilizing edge termination structures, such as those utilized by embodiments described herein, are able to exploit the high critical electric field provided by GaN and related alloys and heterostructures. Edge termination techniques such as field plates and guard rings provide proper edge termination by alleviating high fields at the edge of the semiconductor device. When properly employed, edge termination allows a semiconductor device to break down uniformly at its main junction rather than uncontrollably at its edge. In addition, utilizing edge termination structures as described herein to completely surround the low voltage gate and source regions, results in smaller devices, simplified processing, and more reliable operation.

According to embodiments of the present invention, gallium nitride (GaN) epitaxy on pseudo-bulk GaN substrates is utilized to fabricate edge termination structures and/or semiconductor devices not possible using conventional techniques. For example, conventional methods of growing GaN include using a foreign substrate such as silicon carbide (SiC). This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create edge termination structures for various types of semiconductor devices.

Figure 1A:
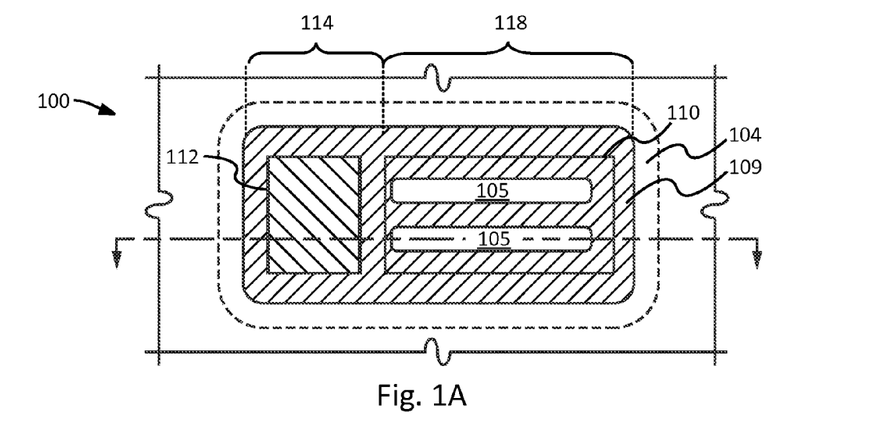
FIGS. 1A and 1B illustrate top and cross-sectional views of a vertical power transistor.
Figure 1B:
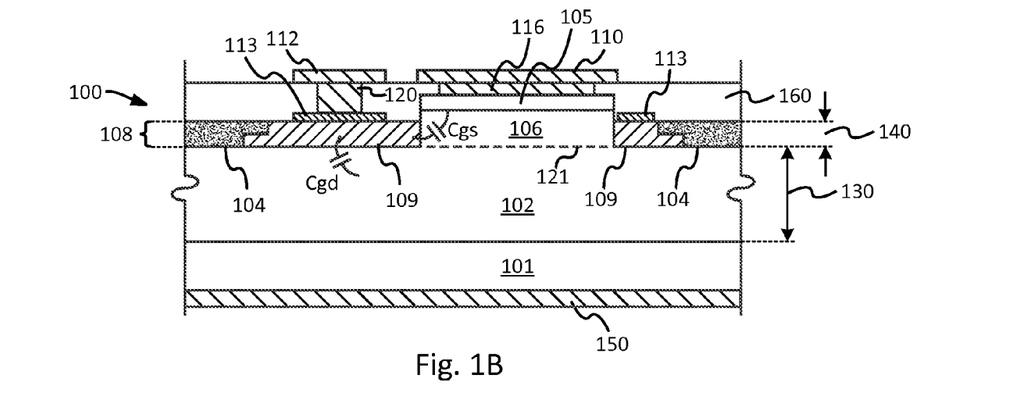

FIGS. 1A and 1B illustrate respective top and cross-sectional views of a vertical power device 100. Processes for the fabrication of vertical power device 100 are provided in commonly assigned U.S. patent application Ser. No. 13/289,219, filed on Nov. 4, 2011, the disclosure of which is hereby incorporated by reference. Further details related to fabricating edge termination structures are provided in the following commonly assigned U.S. Patent Applications:

(a) U.S. patent application Ser. No. 13/270,606, filed on Oct. 11, 2011,
(b) U.S. patent application Ser. No. 13/299,254, filed on Nov. 17, 2011,
(c) U.S. patent application Ser. No. 13/335,355, filed on Dec. 22, 2011, and
(d) U.S. patent application Ser. No. 13/315,720, filed on Dec. 9, 2011.

The disclosures of each of these applications are incorporated by reference herein in their entirety for all purposes.

The vertical power device 100 can include a first III-nitride layer 102 that is coupled to a III-nitride substrate 101. In some embodiments, the III-nitride substrate 101 can be a III-nitride substrate. In a particular embodiment, for example, the III-nitride substrate 101 can be a gallium nitride (GaN) substrate. In some embodiments, the III-nitride substrate 101 can have an n+ conductivity type with dopant concentrations ranging from $1\times10^{17}$ cm$^{-3}$ to $1\times10^{19}$ cm$^{-3}$, and the first III-nitride layer 102 can have a n− conductivity type, with dopant concentrations ranging from $1\times10^{14}$ cm$^{-3}$ to $1\times10^{18}$ cm$^{-3}$.

In some embodiments, the first III-nitride layer 102 can include an epitaxially grown III-nitride layer, e.g., GaN that has n-type conductivity. The first III-nitride layer 102 can serve as a drift region and therefore can be a relatively low-doped material. For example, the first III-nitride layer 102 can have an n-conductivity type, with dopant concentrations ranging from $1\times10^{14}$ cm$^{-3}$ to $1\times10^{18}$ cm$^{-3}$. Furthermore, the dopant concentration can be uniform, or the dopant concentration can vary, for example, as a function of the thickness of the drift region. In some embodiments, n-type dopants can include silicon, oxygen, selenium, tellurium, or the like.

The thickness 130 of the first III-nitride layer 102 can also vary substantially, depending on the desired functionality. As discussed above, homoepitaxial growth can enable the first III-nitride layer 102 to be grown far thicker than layers formed using conventional methods. In general, in some embodiments, thicknesses can vary between 0.5 μm and 100 μm, for example. In some embodiments, thicknesses are greater than 5 μm. Resulting parallel plane breakdown voltages for the vertical power device 100 can vary depending on the embodiment. Some embodiments provide for breakdown voltages of at least 100V, 300V, 600V, 1.2 kV, 1.7 kV, 3.3 kV, 5.5 kV, 13 kV, or 20 kV.

A second III-nitride layer 108 can be epitaxially grown over the first III-nitride layer 102. In some embodiments, the second III-nitride layer may comprise GaN. The second III-nitride layer 108, from which edge termination structures 104 and gate regions 109 can be eventually formed, can have a conductivity type different than the first III-nitride layer 102. For instance, if the first III-nitride layer 102 is formed from an n-type GaN material, the second III-nitride layer 108 may be formed from a p-type GaN material, and vice versa. In some embodiments, the second III-nitride layer 108 is a continuous regrowth over portions of the first III-nitride layer 102 with other portions of the structure, such as regions of other semiconductor devices, characterized by reduced or no growth as a result of the presence of a regrowth mask (not shown). One of ordinary skill in the art would recognize many variations, modifications, and alternatives.

The thickness 140 of the second III-nitride layer 108 can vary, depending on the process used to form the layer and the device design. In some embodiments, the thickness 140 of second III-nitride layer 108 can be between 0.1 μm and 5 μm.

The gate regions 109 of the second III-nitride layer 108, which can be coupled to and completely surround each of the one or more channel regions 106 can be highly doped, for example in a range from about $5\times10^{17}$ cm$^{-3}$ to about $1\times10^{19}$ cm$^{-3}$. Additionally, as with other epitaxial layers, the dopant concentration of the gate regions 109 can be uniform or non-uniform as a function of thickness. In some embodiments, the dopant concentration increases with thickness, such that the dopant concentration is relatively low near the first III-nitride layer 102 and increases as the distance from the first III-nitride layer 102 increases. Such embodiments provide higher dopant concentrations at the top of the gate regions 109 where metal contacts can be subsequently formed. Other embodiments utilize heavily doped contact layers (not shown) to form Ohmic contacts. In some embodiments, the heavily doped contact layers have at least twice the doping concentration of the second III-nitride layer.

One method of forming the second III-nitride layer 108, and other layers described herein, can be through a regrowth process that uses an in-situ etch and diffusion preparation processes. These preparation processes are described more fully in U.S. patent application Ser. No. 13/198,666, filed on Aug. 4, 2011, the disclosure of which is hereby incorporated by reference in its entirety.

The vertical power device 100 can also include an edge termination region. In the embodiment shown in FIGS. 1A and 1B, the edge termination region comprises one or more edge termination structures 104. In one embodiment, the edge termination structures 104 may be formed by implanting ions into portions of the second III-nitride layer 108, using processes such as those described in U.S. patent application Ser. No. 13/334,742, filed on Dec. 22, 2011, the disclosure of which is hereby incorporated by reference in its entirety. In still other embodiments, the edge termination region may comprise a junction-termination extension (JTE) region, one or more field plates, deep trench termination, and/or a combination of these or other edge termination structures.

As illustrated in FIG. 1A, the second III-nitride layer 108 can include a continuous region 114 and one or more finger-like projections 118. Together the continuous region 114 and the finger-like projections 118 form the gate region of vertical power device 100. In one embodiment, at least some portions of the gate region may also include a low-resistance layer 113 that may be disposed on top of the second III-nitride layer 108. This low-resistance layer preferably forms a low-resistance Ohmic contact to second III-nitride layer 108 and may comprise a metal such as platinum, paladium, nickel, scandium, or other suitable materials. One purpose of this layer can be to reduce the lateral resistance from the gate electrode 112 to various locations on the gate region, which may be advantageous to reduce the distributed gate resistance of the vertical power device 100, and thus improve the switching performance.

The gate electrode 112 is disposed over the continuous region 114 and coupled to the gate region 109 and/or low-resistance layer 113 via gate contacts 120. In some embodiments, the gate electrode 112 can include metals such as nickel, platinum, palladium, silver, gold, copper, etc., and alloys thereof. In some embodiments, the gate electrode 112 can be a multi-layered structure (e.g. a metal stack) comprising, for example, an adhesion layer such as titanium in contact with low-resistance layer 113 and a relatively thick top metal layer, such as aluminum, gold, silver, or copper, which is suitable for attaching the gate electrode to a semiconductor package.

The first III-nitride layer 102 can be patterned and etched to form one or more channel regions 106. The channel region 106 can have a height of between 0.5 µm and 5 µm, a width of between 0.5 µm and 5 µm, and an n-type conductivity with a dopant concentration that is the same as or lower than the dopant concentration of the first III-nitride layer 102. Source regions 105 can be disposed on the top of channel regions 106. The source regions 105 may have the same conductivity type (e.g. p-type) as the channel regions 106 and the III-nitride substrate 101. The doping concentration of the source regions 105 may be substantially higher than the doping concentration of channel regions 106 in order to form a better Ohmic contact.

In one embodiment, the source regions 105 are electrically isolated from the gate region 109. For example, as shown in FIG. 1B, the top of gate region 109 may be recessed below the top of source regions 105 to provide electrical isolation. As shown in FIG. 1A, the channel regions 106 (located beneath source regions 105) can be disposed such that there is one channel region in between two adjacent finger-like projections 118. Together these form the p-n junction of a diode. Details of the placement of the source and gate structures are described more fully below. Optionally (as shown by line 121), a third III-nitride layer can be coupled to first III-nitride layer 102 and etched to form the channel regions 106, in addition or as an alternative to forming channel regions 106 by etching the first III-nitride layer 102.

A source electrode 110 is coupled to the source regions 105 via source contacts 116. In some embodiments, the source electrode 110 can include metals such as titanium, aluminum, nickel, gold, etc. and alloys thereof. In some embodiments, the source electrode 110 can be a multi-layered structure comprising, for example, an conctact layer such as titanium that provides a low-resistance Ohmic contact to source regions 105 and a relatively thick top metal layer, such as aluminum, gold, silver, or copper, which is suitable for attaching the gate electrode to a semiconductor package.

An interlayer dielectric layer 160 can be disposed over the gate region 109 and/or edge termination structures 104. One or more gate contacts 120 can be formed in the interlayer dielectric layer 160 to provide electrical connection between the gate region 109 and the gate electrode 112. Likewise, one or more source contacts 116 can be formed in the interlayer dielectric layer 160 to provide electrical connection between the source regions 105 and the source electrode 110. The gate electrode 112 and source electrode 110 can be located such that the edge termination structures 104 completely surround the gate electrode 112, thereby isolating the gate electrode 112 from the high voltage present on the portion of the first III-nitride layer 102 that lies outside of the edge termination region. Connections to external systems can be made via electrodes 110 and 112 using wire bonding, soldering, sintering, or other techniques.

A drain electrode 150 can be coupled to an opposing surface of III-nitride substrate 101. In one embodiment, drain electrode 150 can be formed from titanium, aluminum, nickel, gold, and/or similar materials to provide an Ohmic contact to III-nitride substrate 101. A second III-nitride epitaxial layer can be disposed over and coupled to first III-nitride layer 102. The second III-nitride epitaxial layer can comprise a continuous region 114, finger-like projections 118, and an edge termination region. As discussed above, the edge termination region may comprise one or more edge termination structures, such as the termination structure 104 of FIGS. 1A and 1B.

Although some embodiments are discussed in terms of GaN substrates and GaN epitaxial layers, the present invention is not limited to these particular binary III-V materials and is applicable to a broader class of III-V materials, in particular III-nitride materials. Additionally, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

The vertical power device 100 utilizes an n-type drift layer (e.g., the portion of first III-nitride layer 102 located below the second III-nitride layer 108) that can be grown on top of an n-type substrate. However, the present invention is not limited to this particular configuration. In other embodiments, substrates with p-type doping can be utilized. Additionally, embodiments can use materials having an opposite conductivity type to provide devices with different functionality. Thus, although some embodiments described herein include n-type GaN epitaxial layer(s) doped with silicon, in other embodiments highly or lightly doped material, p-type material, material doped with dopants in addition to or other than silicon such as Mg, Ca, Be, Ge, Se, S, O, Te, and the like can also be used. The substrates discussed herein can include a single material system or multiple material systems including composite structures of multiple layers. One of ordinary skill in the art would recognize many variations, modifications, and alternatives.

Figure 2:
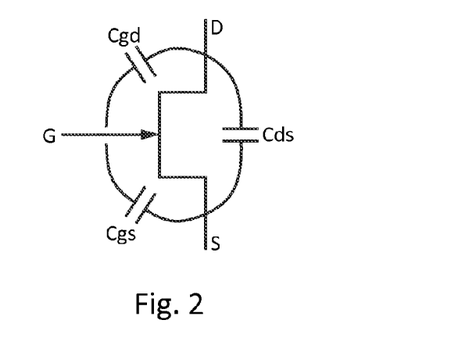
FIG. 2 illustrates a circuit schematic of a JFET transistor showing the gate-source, drain-source, and gate-drain capacitances.

FIG. 2 is a circuit schematic diagram showing some of the relevant capacitances that are present in the vertical power device 100 of FIG. 1. In a power switching application, it is generally preferable to minimize the value of the gate-drain capacitance $C_{gd}$, because this capacitance is amplified by the gain of the vertical power device (Miller effect) and keeps the gate of the vertical power device from turning off while the drain-source voltage is rapidly increasing during, for example, a fast turn-off transition. Thus, a lower $C_{gd}$ helps to lower the power dissipated in the vertical power device during turn-off. It is also desirable to maximize the ratio of gate-source capacitance $C_{gs}$ to $C_{gd}$, because this ratio also affects the gate voltage during fast switching events. A higher ratio of $C_{gs}$ to $C_{gd}$ helps prevent a phenomenon called "re-turn-on" in which the gate is turned back on during a fast turn-off transition. Drain-source capacitance $C_{ds}$ creates switching losses, but generally has much less impact than $C_{gd}$.

Figure 3A:
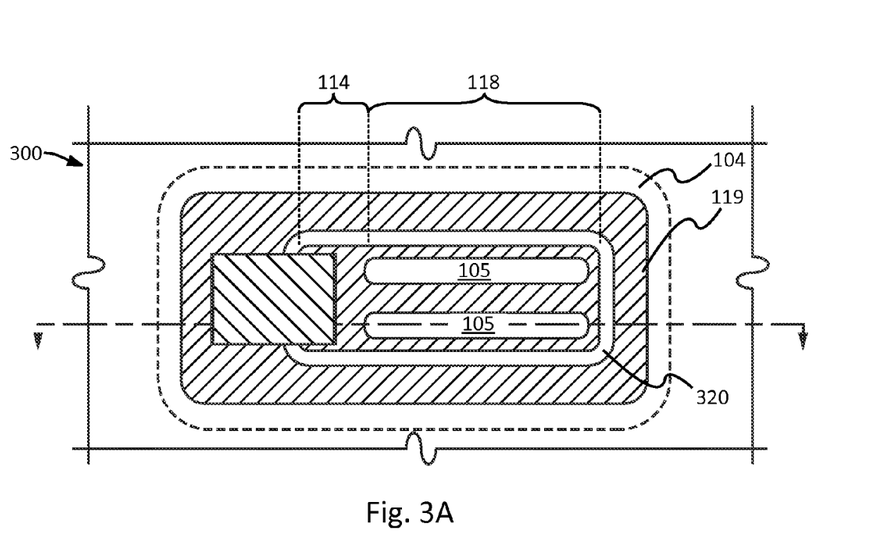
FIGS. 3A and 3B illustrate top and cross-sectional views of a power transistor according to one embodiment of the present invention.
Figure 3B:
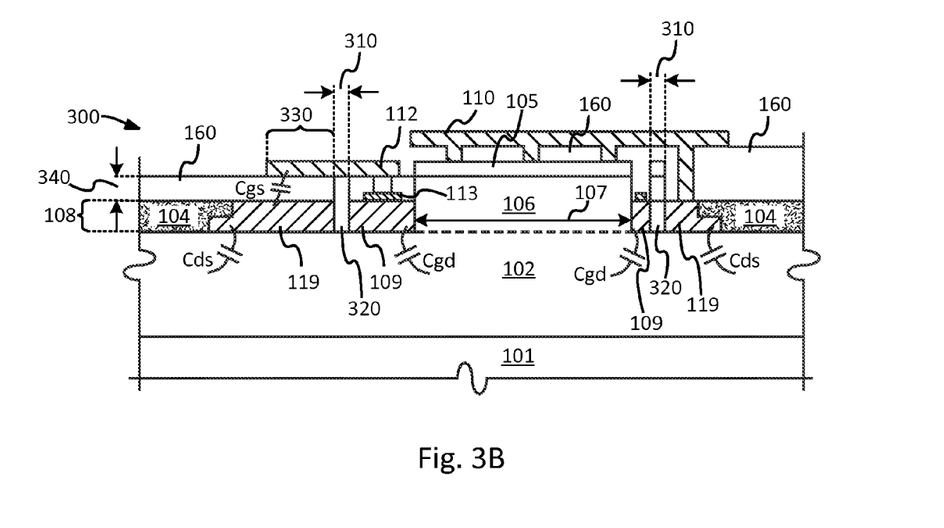

FIGS. 3A and 3B show top and cross-sectional views of a vertical power device 300 according to an embodiment of the present invention. Many of the components of the vertical power device 300 of FIGS. 3A and 3B can be the same or similar to corresponding components the vertical power device 100 of FIG. 1, with similar physical features and/or characteristics. Here, however, the vertical power device 300 of FIGS. 3A and 3B includes a second III-nitride layer 108 that is divided into a gate region, which includes a continuous region 114 and one or more finger-like projections 118, and a source-coupled region 119 that surrounds the gate region and underlies the gate electrode 112. As described herein below, the source-coupled region 119 can comprise a III-nitride structure formed from the same III-nitride epitaxial layer as the gate region 109. A gap 320 separates the gate region 109 (including regions 114 and 118) from the source-coupled region 119. The width 310 of the gap 320 can be chosen to be small enough such that, when both gate and source electrodes are at low voltage (e.g. near ground) and the drain electrode is at high voltage, the depletion regions formed in the drift region (i.e., the first III-nitride layer 102 below the channel regions 106) by the gate region 109 and source-coupled region 119 merge and prevent any excessively high electric fields from occurring. The width 310 of the gap 320 may be the same or smaller than the width 107 of the channel regions 106, for example in the range of 0.2 μm-2.0 μm.

In other embodiments, the electrical isolation of gate region 109 and source-coupled region 119 may be accomplished by an implanted isolation region. For example, second III-nitride layer 108 may be continuous and a masked ion implantation step may be used to locally change this layer from a highly-conductive P-type region to an electrically insulating region, thereby effectively forming a gap 320 via electrical isolation. The width 310 of this implanted region is subject to the same considerations as other gaps 320 discussed herein. The ion implantation step may comprise, for example, multiple implantations of nitrogen at various energies to form a continuous electrically insulating region that extends vertically through second III-nitride layer 108.

Because the area of the junction formed between the gate region 109 and the drift region of the vertical power device 300 is greatly reduced, the capacitance between gate and drain, $C_{gd}$, is thereby greatly reduced, as compared with the vertical power device 100 of FIG. 1. The area of the junction formed between the source-coupled region 119 and the drift region causes an increase in $C_{ds}$, but this has much less impact on switching loss. In some embodiments, the area of the junction formed between the gate region 109 and the drift region is smaller than the area of the junction formed between the source-coupled region 119 and the drift region.

In one embodiment, additional $C_{gs}$ is added to the vertical power device 300 by creating an overlap area 330 between the gate electrode 112 and the source-coupled region 119. These two regions serve as plates of a capacitor separated by a dielectric layer 160. The dielectric layer 160 may comprise silicon dioxide, silicon nitride, spin-on-glass, and/or other suitable dielectric materials. The thickness 340 of the dielectric layer 160 can be minimized to provide more $C_{gs}$ for a given area, as long as the breakdown strength is sufficient to support the maximum rated voltage between source and gate, which is usually less than 20V. Thickness 340 of the dielectric layer 211 may be, for example, in the range of 200 Å-5000 Å.

Figure 4A:
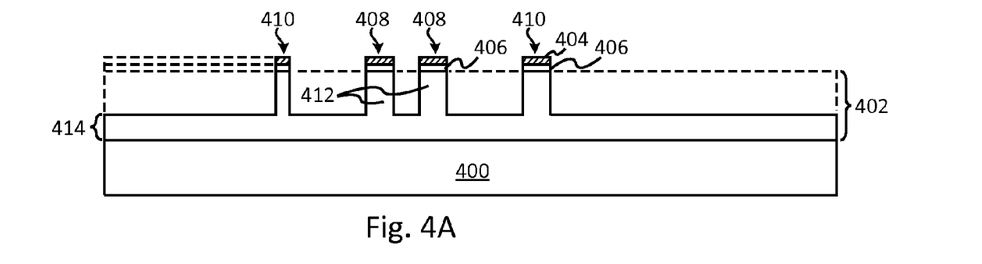
FIGS. 4A-4F illustrate cross-sectional views during various steps in the fabrication of a vertical power transistor according to an embodiment of the present invention.

FIGS. 4A-4F illustrate cross-sectional views during various steps in the fabrication of a vertical JFET according to an embodiment of the present invention. As illustrated in FIG. 4A, a first GaN epitaxial layer 402 is formed on a GaN substrate 400 having the same conductivity type. The GaN substrate 400 can be a pseudo-bulk or bulk GaN material on which the first GaN epitaxial layer 402 is grown. Dopant concentrations (e.g., doping density) of the GaN substrate 400 can vary, depending on desired functionality. For example, the GaN substrate 400 can have an n+ conductivity type, with dopant concentrations ranging from $1 \times 10^{17}$ cm$^{-3}$ to $1 \times 10^{19}$ cm$^{-3}$. Although the GaN substrate 400 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the first GaN epitaxial layer 402 can also vary, depending on desired functionality. At least a portion of the first GaN epitaxial layer 402 can serve as a drift region for the vertical JFET device, and therefore can be a relatively low-doped material. For example, the first GaN epitaxial layer 402 can have an n– conductivity type, with dopant concentrations ranging from $1 \times 10^{14}$ cm$^{-3}$ to $1 \times 10^{18}$ cm$^{-3}$. Furthermore, the dopant concentration can be uniform, or can vary, for example, as a function of the thickness of the drift region.

FIG. 4A further illustrates a source region 406 overlying the first GaN epitaxial layer 402 and a regrowth masking material 404 overlying the source region 406. The source region 406 may have the same conductivity type (e.g. p-type) as the first GaN epitaxial layer 402 and the substrate 400. The doping concentration of the source region 406 may be substantially higher than the doping concentration of first GaN epitaxial layer 402, in order to form a better Ohmic contact, as discussed below. By way of example, the source region 406 may have a doping concentration in the range of $1\times10^{18}$ cm$^{-3}$ to $1\times10^{20}$ cm$^{-3}$, and a thickness in the range of 20 to 500 nm. Regrowth masking material 404 can be a material that inhibits the growth of epitaxial GaN during the processing steps described below. By way of example, regrowth masking material 404 may comprise silicon dioxide, silicon nitride, molybdenum, or other suitable materials, and may have a thickness in the range of 100 to 1000 nm.

In some embodiments, the layers 402, 404, and 406 are grown or deposited as continuous layers covering the entire surface of the GaN substrate 400. A masking material, photolithography, and wet and/or dry etching steps (not shown) are used to remove portions of the layers 402, 404, and 406, leaving mesas 408 and 410. The portions of the mesas 408 comprising portions of the first GaN epitaxial layer 402 serve as channel regions 412 of the vertical JFET, while the unetched portion of first GaN epitaxial layer 402 serves as the drift region 414 of the vertical JFET. The doping concentration in channel regions 412 may be the same as that of drift region 414 or, in some embodiments, these doping concentrations may be different in order to achieve the desired channel properties and drift region properties. The other mesas 410 can serve as separation regions, or gaps (corresponding to gaps 320 of FIGS. 3A and 3B), that separate the subsequently-formed second GaN epitaxial layer into gate and source-coupled regions.

Figure 4B:
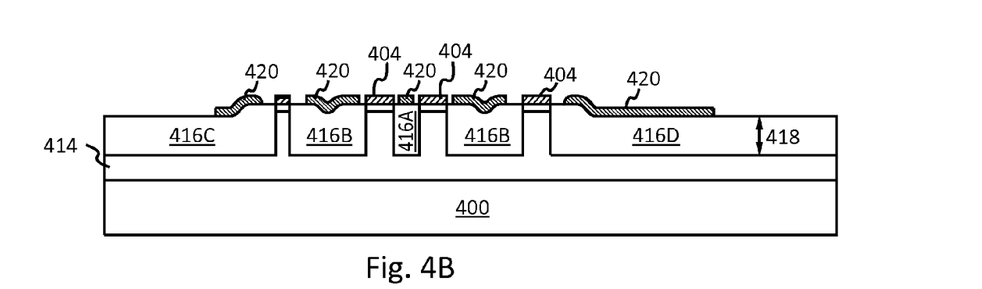

FIG. 4B illustrates the formation of a second GaN epitaxial layer 416 on top of the drift region 414 and surrounding the mesas 408 and 410. The second GaN epitaxial layer 416 has a conductivity type opposite that of the first GaN epitaxial layer 402. For instance, if the first GaN epitaxial layer 402 is formed from an n-type GaN material, the second GaN epitaxial layer 416 can be formed from a p-type GaN material, and vice versa. In some embodiments, the second GaN epitaxial layer 416 is formed by a selective epitaxial regrowth process in which the second GaN epitaxial layer 416 is formed over the exposed portions of the first GaN epitaxial layer 402, but the second GaN epitaxial layer 416 is not formed on areas protected by the regrowth masking material 404. The second GaN epitaxial layer 416 can comprise a p+GaN epitaxial layer with a dopant concentration in a range from about $5\times10^{17}$ cm$^{-3}$ to about $1\times10^{19}$ cm$^{-3}$.

In some embodiments, the horizontal growth rate of the second GaN epitaxial layer 416 from the sides of the mesas 408 and 410 can be faster than the vertical growth rate from the top of the drift region 414. Thus the surface of the second GaN epitaxial layer 416 can be substantially planar in areas between closely spaced mesas, as shown for regions 416A and 416B. In outlying areas, such as 416C and 416D, the second GaN epitaxial layer 416 has a thickness 418. In some embodiments, the thickness 418 of second GaN epitaxial layer 416 is between 0.1 μm and 5 μm. One method of forming the second GaN epitaxial layer 416, and other layers described herein, can be through a regrowth process that uses an in-situ etch and diffusion preparation processes.

FIG. 4B also shows the formation of a p-ohmic metallization layer 420, corresponding to low-resistance layer 113 of FIGS. 3A and 3B. P-ohmic metallization layer 420 can be a contact layer comprising one or more metals that makes a good Ohmic contact to the p-type GaN of second GaN epitaxial layer 416, such as platinum, palladium, nickel, scandium, and/or other suitable materials. P-ohmic metallization layer 420 may be patterned by lift-off processing or by photolithography and etching steps.

Figure 4C:
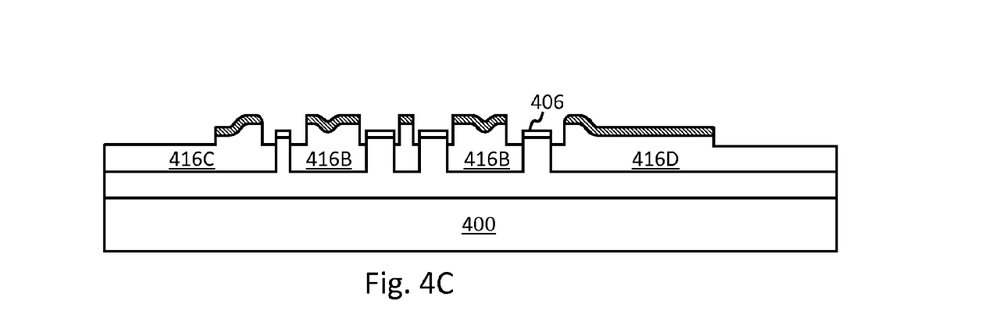

FIG. 4C is a simplified cross-sectional diagram illustrating the removal of portions of the second GaN epitaxial layer 416 to provide separation between the remaining portions of the second GaN epitaxial layer 416 and the source regions 406. In some embodiments this removal step comprises an etching step that is self-aligned to the regrowth masking material 404 and p-ohmic metallization layer 420. In this self-aligned process, no photolithography is required. Instead, an etching process is chosen that removes the exposed portions of the second GaN epitaxial layer 416 without substantially etching either the regrowth masking material 404 or p-ohmic metallization layer 420. For example, an inductively-coupled plasma (ICP) etching step may be used. After removing the portions of the second GaN epitaxial layer 416, the regrowth masking material 404 is completely removed, exposing the source regions 406. For example, a wet etch using hydrofluoric acid may be used to remove silicon dioxide and/or silicon nitride used for regrowth masking material 404.

In some embodiments, the separation between the second GaN epitaxial layer 416 and the source regions 406 may be provided by one or more self-alignment techniques, as shown in U.S. patent application Ser. No. 13/334,514, filed on Dec. 22, 2011, which is incorporated by reference herein in its entirety for all purposes.

Figure 4D:
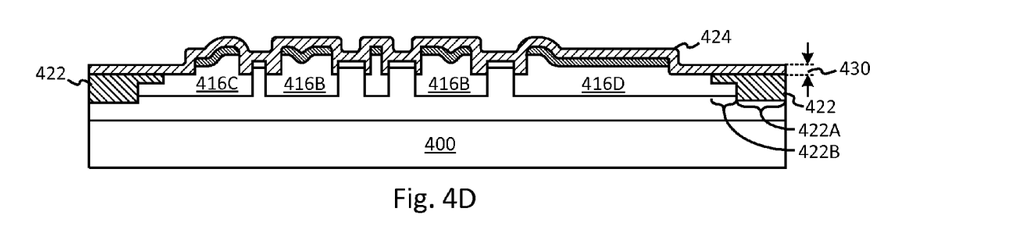

FIG. 4D is a simplified cross-sectional diagram illustrating the formation of edge termination regions 422 and an inter-level dielectric layer (ILD) 424. In some embodiments, the edge termination regions 422 may be formed by implanting ions into portions of the second GaN epitaxial layer 416 to greatly reduce the conductivity of the implanted area. Reducing the conductivity of the entire thickness of the second GaN epitaxial layer 416, as in the portion 422A, can electrically isolate the remaining portions of second GaN epitaxial layer 416 from regions that lie outside of edge termination regions 422 (not shown). The edge termination regions 422 may also comprise a junction-termination extension (JTE) region 422B formed by reducing the conductivity of only a portion of the thickness of the second GaN epitaxial layer 416. Moreover, edge the edge termination regions 422 may comprise one or more field plates, deep trench termination, and/or a combination of these or other edge termination structures.

The ILD 424 preferably can comprise a dielectric material such as silicon nitride, silicon dioxide, spin-on glass, or similar materials. The ILD 424 may be formed using a deposition process that can be at least somewhat conformal to the underlying surface features, such that few or no voids or gaps are present between the ILD 424 and the other features. ILD 424 may also have varying thicknesses such that it at least partially planarizes the top surface of the resulting structure, which can ease subsequent processing steps. The ILD 424 can provide electrical isolation between p-ohmic metallization layer 420 and the pad metal described below. Therefore, the dielectric strength and thickness of the ILD 424 can be chosen to reliably withstand the maximum voltages between these metal layers (e.g. up to 20V). A portion of the ILD 424 will also separate the two plates of a capacitor formed between gate and source. The thickness 430 of the ILD 424 can be as small as practical to maximize the capacitance per unit area. By way of example, the ILD 424 may have a thickness 430 in the range of 20 to 400 nm.

Although the ILD 424 is shown in direct contact with edge termination regions 422, in other embodiments, there may be an additional dielectric layer inserted between the ILD 424 and the edge termination regions 422. For example, it may be preferable to have a high quality silicon nitride layer in contact with the edge termination regions 422, and to use a silicon dioxide layer for the ILD 424. Contemplated embodiments can make use of these and other modifications.

Figure 4E:
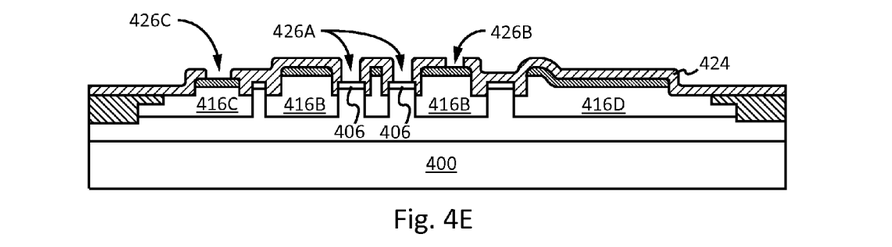

FIG. 4E illustrates the formation of contact openings 426 in ILD 424. The contact openings 426 may be formed by photolithography and etching steps to selectively remove portions of the ILD 424 such that underlying layers are exposed. For example, ICP etching and/or wet etches may be used to form the contact openings 426. Some contact openings 426A expose the top of the source regions 406, while another opening 426B exposes the top of one portion of p-ohmic metallization layer 420 coupled to the gate region 416B, and remaining opening 426C exposes the top of another portion of p-ohmic metallization layer 420 coupled to the source-coupled regions 416C and 416D.

Figure 4F:
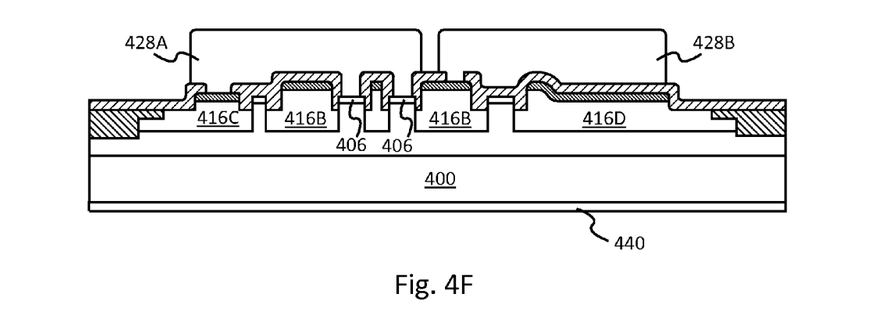

FIG. 4F is a simplified cross-sectional diagram illustrating the formation and patterning of a pad metal 428, which can comprise one or more metal layers to provide good electrical contact to source regions 406. In some embodiments, the source regions 406 may comprise heavily doped n-type GaN and good electrical contact may be provided by a lower layer of the pad metal 428 comprising titanium, aluminum, indium, gallium, or other suitable materials. In some embodiments, an upper layer of the pad metal 428 can allow for electrical interconnection between the vertical JFET and a semiconductor package or other devices. For example, an upper layer of pad metal 428 may comprise a relatively thick (e.g. 2-4 microns) layer of aluminum, copper, gold, silver, or other suitable materials.

The pad metal 428 can be patterned to form the top electrodes of the vertical JFET. The source electrode 428A electrically connects the source regions 406 and outer portions 416C and 416D of second GaN epitaxial layer 416, the outer portions 416C and 416D forming source-coupled regions as described in reference to FIGS. 3A and 3B. The gate electrode 428B is electrically connected to inner portions 416A and 416B, which serve as the gates of the vertical JFET.

FIG. 4F also shows the formation of a backside metal 440, which can serve as the drain electrode of the vertical JFET. The backside metal 440 may comprise one or more layers of metal that provide good Ohmic contact to the GaN substrate 400. For example, the GaN substrate 400 may be heavily-doped p-type GaN and the innermost layer of backside metal 440 may comprise indium, titanium, aluminum, or other suitable materials. In some embodiments, an outermost layer of the backside metal 440 may comprise gold, silver, or other materials suitable for attaching the vertical JFET to a semiconductor package or other devices. The backside metal 440 may be formed using any of a variety of methods such as sputtering, evaporation, electroplating, or the like.

Figure 5:
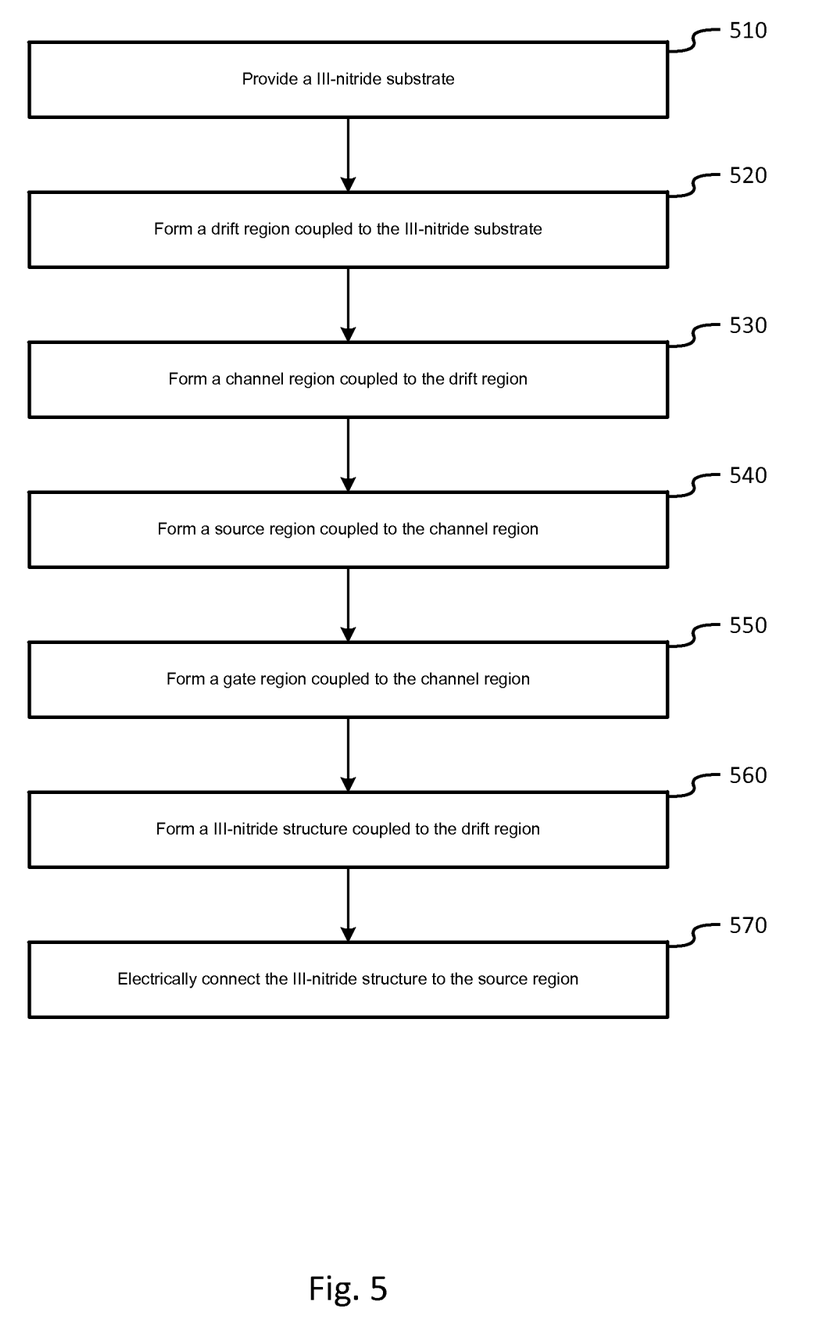
FIG. 5 illustrates a method of fabrication of a vertical power transistor, according to an embodiment of the present invention.

FIG. 5 is a simplified flowchart illustrating a method of fabricating a vertical JFET with reduced gate-to-drain capacitance according to an embodiment of the present invention. A III-nitride substrate is provided (510). In an embodiment, the III-nitride is an n-type GaN substrate. The method also includes forming a drift region coupled to the III-nitride substrate (520), and forming a channel region coupled to the drift region (530). The drift and/or channel regions may be formed from a III-nitride epitaxial layer (e.g., an n-type GaN epitaxial layer) coupled the III-nitride substrate and subsequently etched to form the channel regions. As described herein, separation regions, used to separate gate regions from the source-coupled structures (III-nitride structures) described herein, can also be formed from the III-nitride epitaxial layer.

The method includes forming a source region coupled to the channel region (540). As described previously, the source region can comprise a III-nitride material of the same conductivity type as the channel region (e.g., n-type GaN). However, the source region may include high dopant concentrations in relation to the channel region.

The method further includes forming a gate region coupled to the channel region (550) and a III-nitride structure coupled to the drift region (560). As described elsewhere herein, the III-nitride structure can comprise a source-coupled structure, which may encircle the gate region. Moreover, the gate region and III-nitride structure may be formed from a layer of III-nitride material, separated and/or formed into separate regions. The gate region can also be coupled to at least a portion of the drift region, and an area defined by a junction of the gate region and the drift region can be smaller than an area defined by a junction of the source-coupled region and the drift region, in some embodiments.

The method also includes electrically connecting the III-nitride structure to the source region. This electrical connection can be made using pad metals, contact metals, and/or other metals structures, as well as other electrically-conductive materials, depending on desired functionality.

In some embodiments, other steps can be included. For example, one or more edge termination structures can be formed to provide edge termination for the vertical power device. The edge termination structures can be shaped in any of a variety of shapes based on the physical characteristics of the vertical power device and other considerations. In some embodiments, the edge termination structure may comprise a guard ring surrounding at least the channel and gate regions. Embodiments may also include partial removal of one or more layers and/or regions to help isolate different features, as shown in FIG. 4C. Some embodiments may include multiple channel regions, which gate regions coupled to each of the channel regions. In some embodiments, one or more dielectrics can be used to separate a gate electrode with the source-coupled region. Embodiments may also include a dielectric layer is disposed between at least a portion of the source region and at least a portion of the source electrode, the source electrode being in electrical contact with the source region via one or more contacts through the dielectric layer (as shown, for example, in FIG. 3B).

It should be appreciated that the specific steps illustrated in FIG. 5 provide a particular method of fabricating a vertical power device with edge termination structures according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

One of ordinary skill in the art would recognize many variations, modifications, and alternatives to the examples provided herein. As illustrated herein, edge termination structures, contacts, metal layers, and/or various other components and/or regions of the semiconductor devices described herein can be provided in any of a variety of shapes and forms, depending on physical features of the semiconductor device. Additionally or alternatively, conductivity types of the examples provided herein can be reversed (e.g., replacing an n-type semiconductor material with a p-type material, and vice versa), depending on desired functionality. Moreover, embodiments provided herein using GaN can use other III-nitride materials in addition or as an alternative to GaN. Other variations, alterations, modifications, and substitutions are contemplated.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method comprising:
providing a III-nitride substrate;
forming a channel region and a drift region, wherein:
the drift region and the channel region comprise a III-nitride material of a first conductivity type, and
the drift region is coupled to the III-nitride substrate;
forming a source region coupled to the channel region;
forming a gate region coupled to the channel region, wherein the gate region comprises a III-nitride material of a second conductivity type;
forming a source-coupled region coupled to the drift region; and
electrically connecting the source-coupled region to the source region.

2. The method of claim 1 wherein an area defined by a junction of the gate region and the drift region is smaller than an area defined by a junction of the source-coupled region and the drift region.

3. The method of claim 1 wherein forming either or both of the channel region or the drift region comprises:
forming a III-nitride epitaxial layer coupled to the III-nitride substrate; and
removing at least a portion of the III-nitride epitaxial layer.

4. The method of claim 1 further comprising forming an edge termination structure surrounding the gate region, the source-coupled region, and the channel region.

5. The method of claim 1 wherein:
the gate region and the source-coupled region are formed such that a gap is disposed between the gate region and the source-coupled region; and
the gap has a width smaller than a width of the channel region.

6. The method of claim 1 further comprising forming a p-ohmic contact layer electrically coupled to the source-coupled region.

7. The method of claim 6 further comprising forming a dielectric layer coupled to the p-ohmic contact layer.

8. The method of claim 7 further comprising forming a gate electrode such that:
the gate electrode is electrically connected to the gate region; and
the dielectric layer is disposed between at least a portion of the p-ohmic contact layer and at least a portion of the gate electrode.

9. The method of claim 1 wherein electrically connecting the source-coupled region to the source region comprises forming at least one metal layer coupled to the source-coupled region and the source region.

10. The method of claim 1 wherein the drift region and the channel region are formed from a single III-nitride epitaxial layer.

11. The method of claim 1 further comprising forming a source electrode such that a dielectric layer is disposed between at least a portion of the source region and at least a portion of the source electrode.

12. A method comprising:
providing a III-nitride substrate;
forming a first III-nitride epitaxial layer coupled to the III-nitride substrate;
forming a source region coupled to the first III-nitride epitaxial layer;
removing at least a portion of the first III-nitride epitaxial layer and at least a portion of the source region to form a channel region, a drift region, and a separation region;
forming a second III-nitride epitaxial layer coupled to the channel region and the drift region, the second III-nitride epitaxial layer comprising a gate region and a source-coupled region, wherein the gate region and the source-coupled region are separated by the separation region; and
forming a metal structure electrically connecting the source region with the source-coupled region.

13. The method of claim 12 further comprising forming an Ohmic metal contact coupled to the source-coupled region, wherein the metal structure is coupled to the Ohmic metal contact.

14. The method of claim 12 further comprising:
forming a dielectric layer; and
forming a second metal structure;
wherein:
the second metal structure is electrically connected to the gate region; and
the dielectric layer is disposed between at least a portion of the source-coupled region and at least a portion of the second metal structure.

15. The method of claim 12 wherein:
the gate region is coupled to the drift region at a first area of a surface of the drift region; and
the source-coupled region is coupled to the drift region at a second area of the surface of the drift region, the second area being larger than the first area.

16. The method of claim 12 further comprising forming an edge termination structure surrounding the source-coupled region, the gate region, and the channel region.

17. The method of claim 12 wherein:
the gate region and the source-coupled region are formed such that a gap is disposed between the gate region and the source-coupled region; and
the gap has a width smaller than a width of the channel region.

18. The method of claim 12 further comprising a drain electrode electrically coupled to the III-nitride substrate.

* * * * *